United States Patent
Hwang

(10) Patent No.: US 10,204,885 B2
(45) Date of Patent: Feb. 12, 2019

(54) SEMICONDUCTOR PACKAGE INCLUDING STACKED SEMICONDUCTOR CHIPS ELECTRICALLY CONNECTED TO REDISTRIBUTION LAYERS

(71) Applicant: Samsung Electronics Co., Ltd., Suwon-si, Gyeonggi-do (KR)

(72) Inventor: Tae Joo Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/477,617

(22) Filed: Apr. 3, 2017

(65) Prior Publication Data

US 2018/0102339 A1 Apr. 12, 2018

(30) Foreign Application Priority Data

Oct. 10, 2016 (KR) .................. 10-2016-0130503

(51) Int. Cl.
  *H01L 25/065* (2006.01)
  *H01L 23/00* (2006.01)
  *H01L 23/498* (2006.01)

(52) U.S. Cl.
  CPC ........ *H01L 25/0657* (2013.01); *H01L 23/498* (2013.01); *H01L 24/30* (2013.01); *H01L 24/05* (2013.01); *H01L 24/06* (2013.01); *H01L 24/16* (2013.01); *H01L 24/32* (2013.01); *H01L 24/48* (2013.01); *H01L 24/49* (2013.01); *H01L 24/73* (2013.01); *H01L 2224/05554* (2013.01); *H01L 2224/0612* (2013.01); *H01L 2224/06145* (2013.01); *H01L 2224/16225* (2013.01); *H01L 2224/32145* (2013.01); *H01L 2224/48091* (2013.01); *H01L 2224/48227* (2013.01); *H01L 2224/49175* (2013.01);
  (Continued)

(58) Field of Classification Search
  CPC ...................................... H01L 24/30
  See application file for complete search history.

(56) References Cited

U.S. PATENT DOCUMENTS 6,704,609 B1 * 3/2004 Shen ............... H01L 23/13
                                                257/E21.514
8,828,796 B1   9/2014 Chi et al.
(Continued)

FOREIGN PATENT DOCUMENTS

| KR | 20130015388 A | 2/2013 |
| KR | 101504899 B1 | 3/2015 |
| KR | 20160060380 A | 5/2016 |

*Primary Examiner* — Lex Malsawma
*Assistant Examiner* — Xia Cross
(74) *Attorney, Agent, or Firm* — Harness, Dickey & Pierce, P.L.C.

(57) ABSTRACT

A semiconductor package may include a first redistribution layer (RDL); a first semiconductor chip on a top surface of the first RDL, the first semiconductor chip including a first circuit surface and a first bottom surface, the first circuit surface having first I/O pads thereon, the first I/O pads configured to electrically connect the first semiconductor chip to the first RDL via first wire bonds; a second semiconductor chip on the first semiconductor chip, the second semiconductor chip including a second circuit surface and a second bottom surface; and a second RDL on the second semiconductor chip, the second RDL facing both the first circuit surface and the second circuit surface.

18 Claims, 12 Drawing Sheets

(52) U.S. Cl.
CPC ............... *H01L 2224/73253* (2013.01); *H01L 2224/73265* (2013.01); *H01L 2924/00014* (2013.01); *H01L 2924/15311* (2013.01)

(56) References Cited

U.S. PATENT DOCUMENTS

| | | |
|---|---|---|
| 8,835,228 B2 | 9/2014 | Mohammed |
| 9,281,284 B2 | 3/2016 | Yap et al. |
| 9,397,081 B2 | 7/2016 | Chen et al. |
| 2008/0197469 A1 | 8/2008 | Yang et al. |
| 2014/0027930 A1* | 1/2014 | Hosomi ............... H01L 23/49 257/777 |
| 2015/0115394 A1 | 4/2015 | Pagaila et al. |
| 2015/0200186 A1* | 7/2015 | Park ............... H01L 25/0657 257/774 |
| 2015/0243636 A1 | 8/2015 | Hu et al. |
| 2015/0303174 A1 | 10/2015 | Yu et al. |
| 2016/0133585 A1 | 5/2016 | Kwon et al. |

* cited by examiner

SEMICONDUCTOR PACKAGE INCLUDING STACKED SEMICONDUCTOR CHIPS ELECTRICALLY CONNECTED TO REDISTRIBUTION LAYERS

This application claims priority to Korean Patent Application No. 10-2016-0130503, filed on Oct. 10, 2016, and all the benefits accruing therefrom under 35 U.S.C. § 119, the disclosure of which is incorporated herein by reference in its entirety.

BACKGROUND

1. Field

The present disclosure relates to a semiconductor package.

2. Description of the Related Art

Integrated circuits (ICs) can be fabricated on a single wafer. The wafer can be diced to obtain individual dies that can be packaged separately. Semiconductor devices have increasingly become compact in size and highly functional. Also, demands for the integration of as many elements as possible within a given area are growing. Accordingly, the size of semiconductor packages has gradually decreased.

Examples of a packaging method for the miniaturization of semiconductor devices include wafer level packaging (WLP), in which the ICs may be packaged prior to dicing the wafer into IC dies. A wafer level package generally includes a redistribution layer (RDL) for electrically connecting circuitry within the IC dies to an exterior connection. The RDL may be used in fan-out wiring for contact pads of the IC dies.

SUMMARY

At least some example embodiments relate to a semiconductor package capable of improving the yield of the semiconductor package by vertically stacking a plurality of semiconductor chips in a fan-out wafer level package so as to reduce the thickness of the semiconductor package.

At least some example embodiments also relate to a semiconductor package capable of allowing various connection methods to be used by vertically stacking a plurality of semiconductor chips in a fan-out wafer level package and connecting a redistribution layer (RDL) and the semiconductor chips via wire bonding.

However, example embodiments are not restricted to those set forth herein. The above and other example embodiments will become more apparent to one of ordinary skill in the art to which the present disclosure pertains by referencing the detailed description of the present disclosure given below.

According to some example embodiments, a semiconductor package may include a first redistribution layer (RDL); a first semiconductor chip on a top surface of the first RDL, the first semiconductor chip including a first circuit surface and a first bottom surface, the first circuit surface having first I/O pads thereon, the first I/O pads configured to electrically connect the first semiconductor chip to the first RDL via first wire bonds; a second semiconductor chip on the first semiconductor chip, the second semiconductor chip including a second circuit surface and a second bottom surface; and a second RDL on the second semiconductor chip, the second RDL facing both the first circuit surface and the second circuit surface.

According to some other example embodiments, a semiconductor package may include a first semiconductor chip having first I/O pads on a top surface thereof; a second semiconductor chip on the first semiconductor chip such that the first I/O pads are exposed, the second semiconductor chip having contacts on a top surface thereof; a first RDL below the first semiconductor chip, the first RDL electrically connected to the first I/O pads via first wire bonds; and a second RDL on the second semiconductor chip such that the second RDL covers the contacts, the second RDL electrically connected to second I/O pads.

According to some other example embodiments, a semiconductor package may include a plurality of first semiconductor chips sequentially stacked between a first redistribution layer (RDL) and a second RDL, the plurality of first semiconductor chips each having a circuit surface facing a same direction, a footprint of the plurality of semiconductor chips decreasing from the first RDL to the second RDL such that at least one the plurality of first semiconductor chips includes at least one input/output (I/O) pad on an exposed portion of the circuit surface associated therewith.

Other features and example embodiments may be apparent from the following detailed description, the drawings, and the claims.

BRIEF DESCRIPTION OF THE DRAWINGS

The above and other example embodiments and features will become more apparent by describing in detail some example embodiments thereof with reference to the attached drawings, in which.

DETAILED DESCRIPTION

Unless defined otherwise, all technical and scientific terms used herein have the same meaning as commonly understood by one of ordinary skill in the art to which these example embodiments belongs. It is noted that the use of any and all examples, or exemplary terms provided herein is intended merely to better illuminate the example embodiments and is not a limitation on the scope of the example embodiments unless otherwise specified. Further, unless defined otherwise, all terms defined in generally used dictionaries may not be overly interpreted.

Example embodiments of the present disclosure may be applicable to an integrated fan-out (InFO) package, but the example embodiments are not limited thereto. For example, example embodiments of the present disclosure may also be applicable to various other semiconductor packages.

A semiconductor package according to some example embodiments of the present disclosure will hereinafter be described with reference to FIGS. 1 and 2.

Figure 1:
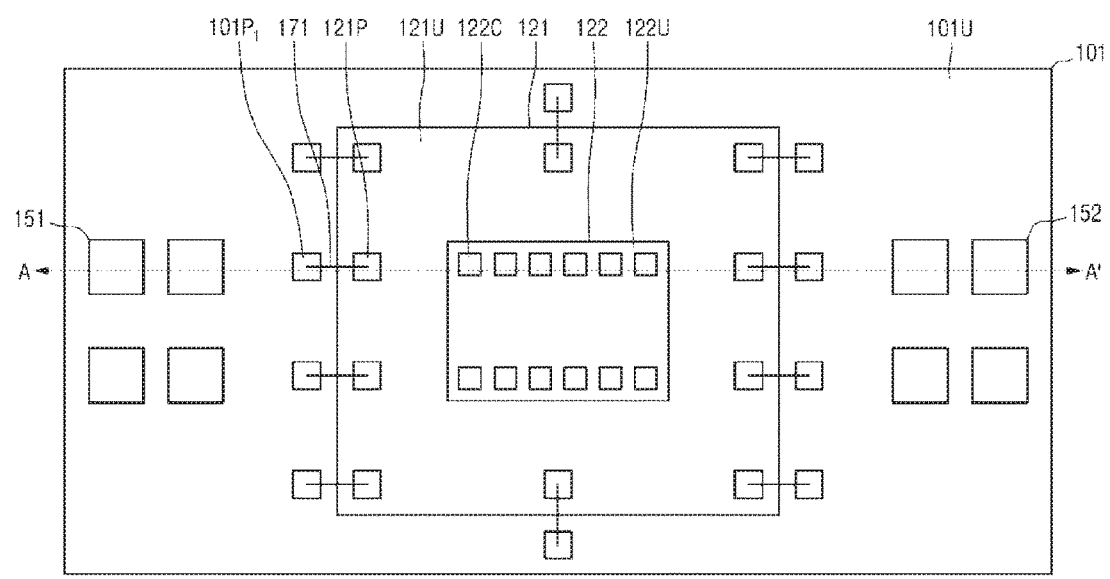
FIG. 1 is a plan view of a semiconductor package according to some example embodiments of the present disclosure.

FIG. 1 is a plan view of a semiconductor package according to some example embodiments of the present disclosure. FIG. 2 is a cross-sectional view taken along line A-A' of FIG. 1.

Figure 2:
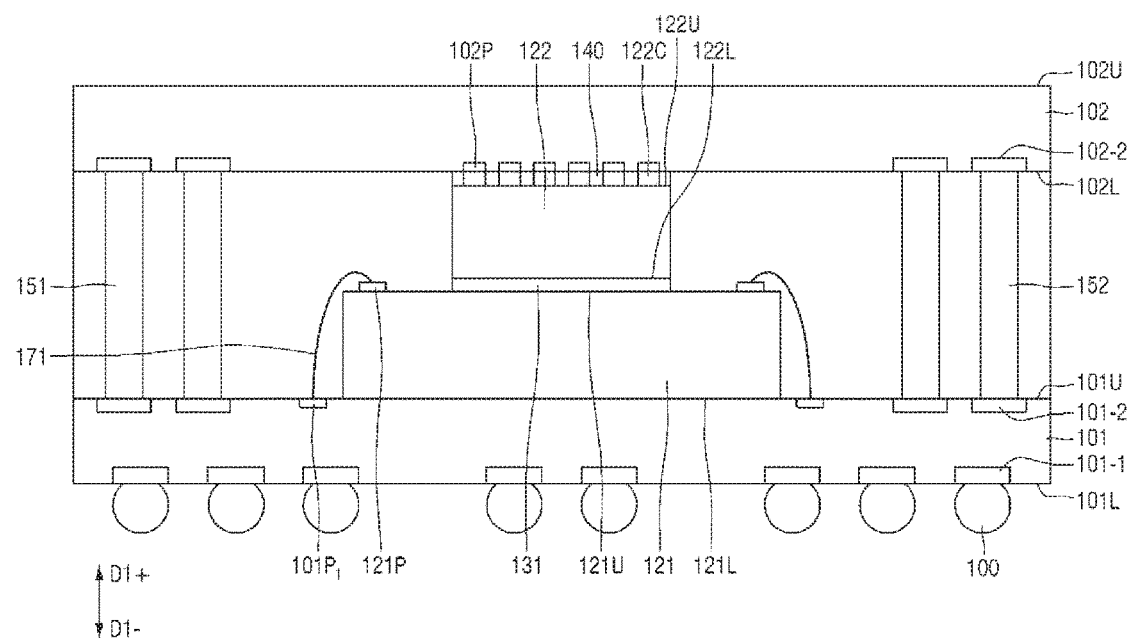
FIG. 2 is a cross-sectional view taken along line A-A' of FIG. 1.

Referring to FIGS. 1 and 2, a semiconductor package according to some example embodiments may include first and second redistribution layers (RDLs) 101 and 102, first and second semiconductor chips 121 and 122, and first wire bonds 171. For clarity, the second RDL 102 and an insulating material 140 are not illustrated in FIG. 1.

The first RDL 101 may include a top surface 101U and a bottom surface 101L, which are opposite to each other. The first RDL 101 may include first bottom finger pads 101-1, which are disposed on the bottom surface 101L of the first RDL 101, and first top finger pads 101-2, which are disposed on the top surface 101U of the first RDL 101. FIGS. 1 and 2 illustrate an example in which the first bottom finger pads 101-1 and the first top finger pads 101-2 are all buried in the first RDL 101 and only the top surfaces of the first bottom finger pads 101-1 and the top surfaces of the first top finger pads 101-2 are exposed at the bottom surface 101L and the top surface 101U of the first RDL 101, respectively, but example embodiments are not limited to this example.

For example, in other example embodiments, only some of the first bottom finger pads 101-1 and only some of the first top finger pads 101-2 may be buried in the first RDL 101, and the other first bottom finger pads 101-1 and the other first top finger pads 101-2 may protrude from the first RDL 101. In still other example embodiments, the first top finger pads 101-2 may all protrude from the top surface 101U of the first RDL 101, and the first bottom finger pads 101-1 may all protrude from the bottom surface 101L of the first RDL 101. In yet still other example embodiments, the first bottom finger pads 101-1 and the first top finger pads 101-2 may be arranged in any combination of the aforementioned examples.

FIGS. 1 and 2 illustrate an example in which a desired (or, alternatively, a predetermined) number of first bottom finger pads 101-1 and a desired (or, alternatively, a predetermined) number of first top finger pads 101-2 are disposed in the first RDL 101, but example embodiments are not limited thereto. That is, in other example embodiments, different numbers of first bottom finger pads 101-1 and different numbers of first top finger pads 101-2 may be disposed in the first RDL 101 as necessary.

The first bottom finger pads 101-1 and the first top finger pads 101-2 may comprise, for example, a conductive material. The first bottom finger pads 101-1 and the first top finger pads 101-2 may electrically connect the first RDL 101 and components disposed outside the first RDL 101 (for example, on the top surface 101U or the bottom surface 101L of the first RDL 101).

The first RDL 101 may include conductive patterns, which are provided in the first RDL 101, particularly, between the top surface 101U and the bottom surface 101L of the first RDL 101. Examples of the conductive patterns may include patterned via holes and pads. For example, the first top finger pads 101-2 and the first bottom finger pads 101-1 may be electrically connected via patterned conductive patterns in the first RDL 101.

First lower contact pads $101P_1$ may be disposed on the top surface 101U of the first RDL 101. For example, as illustrated in FIG. 2, the first lower contact pads $101P_1$ may all be buried in the first RDL 101, and only the top surfaces of the first lower contact pads $101P_1$ may be exposed at the top surface 101U of the first RDL 101. However, example embodiments are not limited to the example of FIG. 2. That is, in other example embodiments, at least some of the first lower contact pads $101P_1$ may be buried in the first RDL 101. In still other example embodiments, the first lower contact pads $101P_1$ may all be disposed on the first RDL 101 to protrude from the top surface 101U of the first RDL 101.

The first lower contact pads $101P_1$ may comprise, for example, a conductive material.

The first lower contact pads $101P_1$ may be connected to the first wire bonds 171 and may thus electrically connect the first semiconductor chip 121 and the first RDL 101.

External connection terminals 100 may be disposed on the bottom surface 101L of the first RDL 101. The external connection terminals 100 may contact the first bottom finger pads 101-1, respectively, and may be electrically connected to the first bottom finger pads 101-1, respectively. The external connection terminals 100 may be electrically connected to components outside the semiconductor package. For example, the external connection terminals 100 may electrically connect the semiconductor package and another semiconductor package having a similar design to the semiconductor package. In other example embodiments, the external connection terminals 100 may electrically connect the semiconductor package and an external semiconductor device.

FIGS. 1 and 2 illustrate an example in which the external connection terminals 100 are solder balls, but example embodiments are not limited to this example. That is, in other example embodiments, the external connection terminals 100 may be solder bumps, grid arrays, and/or conductive tabs.

A plurality of the external connection terminals 100 may be formed on the bottom surface 101L of the first RDL 101.

The first semiconductor chip 121 may be disposed on the top surface 101U of the first RDL 101. The first semiconductor chip 121 may include a first circuit surface 121U and a first bottom surface 121L, which are opposite to each other. The first bottom surface 121L of the first semiconductor chip 121 may contact, for example, the top surface 101U of the first RDL 101.

The first circuit surface 121U of the first semiconductor chip 121 may be, for example, a surface where circuit patterns are formed. Also, the first circuit surface 121U of the first semiconductor chip 121 may be, for example, a surface where first input/output (I/O) pads 121P are formed. The first bottom surface 121L of the first semiconductor chip 121 may be, for example, an opposite surface to the surface where the circuit patterns are formed.

In some example embodiments, the first circuit surface 121U of the first semiconductor chip 121 may be disposed to face a first direction D1+. For example, the first circuit surface 121U of the first semiconductor chip 121 may be disposed to face the second RDL 102 that will be described later.

The first semiconductor chip 121 may be, for example, a logic chip, but example embodiments are not limited thereto. That is, various other chips may be used as the first semiconductor chip 121 as necessary.

The first circuit surface 121U of the first semiconductor chip 121 may include the first I/O pads 121P. In other words, the first I/O pads 121P may be disposed on the first circuit surface 121U of the first semiconductor chip 121. FIGS. 1 and 2 illustrate an example in which the first I/O pads 121P are all disposed on the first circuit surface 121U of the first semiconductor chip 121 to protrude from the first circuit surface 121U of the first semiconductor chip 121, but example embodiments are not limited to this example.

That is, in other example embodiments, at least some of the first I/O pads 121P may be disposed on the first circuit surface 121U of the first semiconductor chip 121. In still other example embodiments, the first I/O pads 121P may all be disposed below the first circuit surface 121U of the first semiconductor chip 121 such that only the top surfaces of the first I/O pads 121P may be exposed at the first circuit surface 121U of the first semiconductor chip 121.

The first I/O pads 121P may comprise, for example, a conductive material.

The first wire bonds 171 may connect the first I/O pads 121P and the first lower contact pads $101P_1$. That is, the first semiconductor chip 121 may be electrically connected to the first RDL 101 via the first wire bonds 171, which are connected to the first I/O pads 121P.

In the semiconductor package according to some example embodiments, the first semiconductor chip 121, which is one of a plurality of semiconductor chips that are vertically stacked, is connected to the first RDL 101 via the first wire bonds 171. Thus, various connection methods may be used. Also, the thickness of the semiconductor package according to at least some example embodiments may be reduced, and as a result, the yield of the semiconductor package according to at least some example embodiments may be improved.

The second semiconductor chip 122 may be disposed on the first semiconductor chip 121. More specifically, the second semiconductor chip 122 may be disposed on the first circuit surface 122U of the first semiconductor chip 121. In some example embodiments, the second semiconductor chip 122 may be disposed on the first semiconductor chip 121 to expose the first I/O pads 121P of the first semiconductor chip 121. The second semiconductor chip 122 may include a second circuit surface 122U and a second bottom surface 122L, which are opposite to each other. The second bottom surface 122L of the second semiconductor chip 122 may contact, for example, a bottom surface 102L of the second RDL 102 that will be described later.

The second circuit surface 122U of the second semiconductor chip 122 may be, for example, a surface where circuit patterns are formed. Also, the second circuit surface 122U of the second semiconductor chip 122 may be, for example, a surface where contacts 122C are formed. The second bottom surface 122L of the second semiconductor chip 122 may be, for example, an opposite surface to the surface where the contacts 122C are formed.

In some example embodiments, the second circuit surface 122U of the second semiconductor chip 122 may be disposed to face the first direction D1+. For example, the second circuit surface 122U of the second semiconductor chip 122 may be disposed to face the second RDL 102 that will be described later.

That is, the first circuit surface 121U of the first semiconductor chip 121 and the second circuit surface 122U of the second semiconductor chip 122 may be disposed to face the same direction, for example, the first direction D1+.

In the semiconductor package according to some example embodiments, the first circuit surface 121U of the first semiconductor chip 121 and the second circuit surface 122U of the second semiconductor chip 122 may be disposed to face the same direction, for example, the first direction D1+. Thus, various connection methods may be used, and the thickness of the semiconductor package according to at least some example embodiments may be reduced.

The second semiconductor chip 122 may be a NAND flash chip, a dynamic random access memory (DRAM) chip, a flash memory chip or a resistance changeable memory chip, but the present disclosure is not limited thereto.

The second circuit surface 122U of the second semiconductor chip 122 may include the contacts 122C. In other words, the contacts 122C may be disposed on the second circuit surface 122U of the second semiconductor chip 122. The contacts 122C may be interposed between the second circuit surface 122U of the second semiconductor chip 122 and the second RDL 102.

The contacts 122C may comprise, for example, a conductive material.

The contacts 122C may electrically connect the second semiconductor chip 122 and the second RDL 102.

The insulating material 140 may be disposed between the second semiconductor chip 122 and the second RDL 102. The insulating material 140 may be disposed among the contacts 122C.

I/O pads that are electrically connected to the contacts 122C may be further disposed on the second circuit surface 122U of the second semiconductor chip 122. For example, in a case in which the second circuit surface 122U of the second semiconductor chip 122 further includes I/O pads, the second semiconductor chip 122 may be electrically connected to the second RDL 102 via the I/O pads. The contacts 122C may be interposed between the I/O pads and the second RDL 102 and may thus electrically connect the second semiconductor chip 122 and the second RDL 102.

The second RDL 102 may be disposed on the second semiconductor chip 122. The second RDL 102 may be disposed on the second semiconductor chip 122 to cover the contacts 122C of the second semiconductor chip 122.

The second RDL 102 may include a top surface 102U and a bottom surface 102L, which are opposite to each other. The second RDL 102 may include second bottom finger pads 102-2, which are disposed on the bottom surface 102L of the first RDL 102. FIGS. 1 and 2 illustrate an example in which the second bottom finger pads 102-2 are all buried in the second RDL 102 and only the top surfaces of the second bottom finger pads 102-2 are exposed on the outside of the second RDL 102, but the present disclosure is not limited to this example.

That is, in other example embodiments, only some of the second bottom finger pads 102-2 may be buried in the second RDL 102, and the other second bottom finger pads 102-2 may protrude from the second RDL 102. In still other example embodiments, the second bottom finger pads 102-2 may all protrude from the bottom surface 102L of the second RDL 102. In yet still other example, the second bottom finger pads 102-2 may be arranged in any combination of the aforementioned examples.

FIGS. 1 and 2 illustrate an example in which a desired (or, alternatively, a predetermined) number of second bottom finger pads 102-2 are disposed on the second RDL 102, but example embodiments are not limited to this example. That is, in other example embodiments, different numbers of second bottom finger pads 102-2 may be disposed on the second RDL 102 as necessary.

The second bottom finger pads 102-2 may comprise, for example, a conductive material. The second bottom finger pads 102-2 may electrically connect the second RDL 102 and components disposed outside the second RDL 102.

Second top finger pads (not shown) may be further disposed on the top surface 102U of the second RDL 102. The second top finger pads may electrically connect the second RDL 102 and the components disposed outside the second RDL 102.

The second RDL 102 may include conductive patterns, which are provided between the top surface 102U and the bottom surface 102L of the second RDL 102. Examples of the conductive patterns may include patterned via holes and pads. For example, the second bottom finger pads 102-2 may be electrically connected to the top surface 102U of the second RDL 102 via patterned conductive patterns in the second RDL 102.

Upper contact pads 102P may be disposed on the bottom surface 102L of the second RDL 102. FIGS. 1 and 2 illustrate an example in which the upper contact pads 102P are buried in the second RDL 102 and only the top surfaces of the upper contact pads 102P are exposed at the bottom surface 102L of the second RDL 102, but example embodiments are not limited to this example. That is, in other example embodiments, at least some of the upper contact pads 102P may be buried in the second RDL 102. In still other example embodiments, the upper contact pads 102P may all be disposed on the bottom surface 102L of the second RDL 102 to protrude from the bottom surface 102L of the second RDL 102.

The upper contact pads 102P may comprise, for example, a conductive material.

The upper contact pads 102P may be connected to the contacts 122C and may thus electrically connect the second semiconductor chip 122 and the second RDL 102.

A first adhesive layer 131 may be interposed between the first and second semiconductor chips 121 and 122. More specifically, the first adhesive layer 131 may contact the first circuit surface 121U of the first semiconductor chip 121 and the second bottom surface 122L of the second semiconductor chip 122.

The first adhesive layer 131 may be disposed to provide adhesion between the first and second semiconductor chips 121 and 122. The first adhesive layer 131 may comprise an ultraviolet (UV) glue, a pressure-sensitive adhesive, a radiation-curable adhesive, an epoxy, or a combination thereof.

First vias 151 and second vias 152 may be disposed between the first and second RDLs 101 and 102 and may connect the first and second RDLs 101 and 102. The first vias 151 and the second vias 152 may be spaced apart from each other. Since the first vias 151 and the second vias 152 may be spaced apart from each other, the first and second semiconductor chips 121 and 122 may be disposed between the first vias 151 and the second vias 152. The first vias 151 and the second vias 152 may connect the second bottom finger pads 102-2 and the first top finger pads 101-2.

A semiconductor package according to some example embodiments of the present disclosure will hereinafter be described with reference to FIGS. 3 and 4, avoiding redundant descriptions for clarity.

Figure 3:
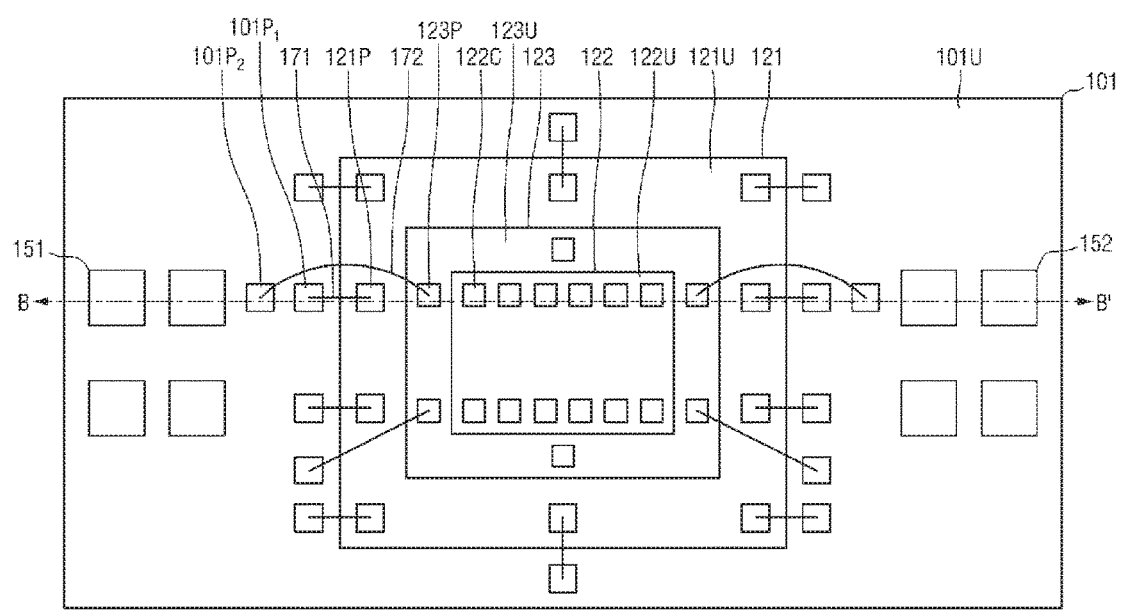
FIG. 3 is a plan view of a semiconductor package according to some example embodiments of the present disclosure.

FIG. 3 is a plan view of a semiconductor package according to some example embodiments of the present disclosure. FIG. 4 is a cross-sectional view taken along line B-B' of FIG. 3. For clarity, a second RDL 102 and an insulating material 140 are not illustrated in FIG. 3.

Figure 4:
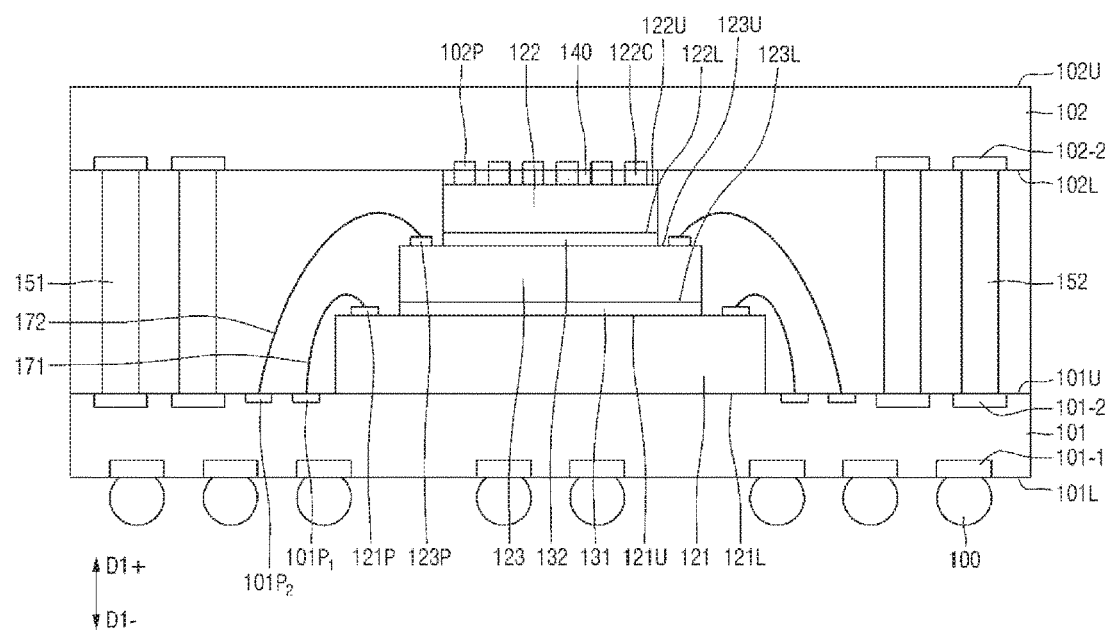
FIG. 4 is a cross-sectional view taken along line B-B' of FIG. 3.

Referring to FIGS. 3 and 4, a semiconductor device according to some example embodiments may further include a third semiconductor chip 123, which is disposed between first and second semiconductor chips 121 and 122. More specifically, the third semiconductor chip 123 may be disposed between a first circuit surface 121U of the first semiconductor chip 121 and a second bottom surface 122L of the second semiconductor chip 122.

The third semiconductor chip 123 may be disposed on the first semiconductor chip 121 to expose first I/O pads 121P of the first semiconductor chip 121.

The third semiconductor chip 123 may include a third circuit surface 123U and a third bottom surface 123L, which are opposite to each other. The third circuit surface 123U of the third semiconductor chip 123 may be, for example, a surface where circuit patterns are formed. Also, the third circuit surface 123U of the third semiconductor chip 123 may be, for example, a surface where third I/O pads 123P are formed. The third bottom surface 123L of the third semiconductor chip 123 may be, for example, an opposite surface to the surface where the circuit patterns are formed.

In some example embodiments, the third circuit surface 123U of the third semiconductor chip 123 may be disposed to face a first direction D1+. For example, the third circuit surface 123U of the third semiconductor chip 123 may be disposed to face a second RDL 102.

That is, the first through third circuit surfaces 121U through 123U of the first through third semiconductor chips 121 through 123 may be disposed to face the same direction, for example, the first direction D1+.

The third circuit surface 123U of the third semiconductor chip 123 may include third I/O pads 123P. In other words, the third I/O pads 123P may be disposed on the third circuit surface 123U of the third semiconductor chip 123. The second semiconductor chip 122 may be disposed on the third semiconductor chip 123 to expose the third I/O pads 123P of the third semiconductor chip 123.

FIGS. 3 and 4 illustrate an example in which the third I/O pads 123P are all disposed on the third circuit surface 123U of the third semiconductor chip 123 to protrude from the third circuit surface 123U of the third semiconductor chip 123, but example embodiments are not limited to this example.

For example, at least some of the third I/O pads 123P may be disposed on the third circuit surface 123U of the third semiconductor chip 123. In other example embodiments, the third I/O pads 123P may be disposed below the third circuit surface 123U of the third semiconductor chip 123 such that only the top surfaces of the third I/O pads 123P may be exposed at the third circuit surface 123U of the third semiconductor chip 123.

The third I/O pads 123P may comprise, for example, a conductive material.

Second wire bonds 172 may connect the third I/O pads 123P and second lower contact pads 101P$_2$. That is, the third semiconductor chip 123 may be electrically connected to a first RDL 101 via the second wire bonds 172, which are connected to the third I/O pads 123P.

The first RDL 101 may further include the second lower contact pads 101P$_2$, which are spaced apart from first lower contact pads 101P1. The second lower contact pads 101P$_2$ may be connected to the second wire bonds 172. The second lower contact pads 101P$_2$ may be substantially the same as, for example, the first lower contact pads 101P$_1$.

A second adhesive layer 132 may be interposed between the second and third semiconductor chips 122 and 123. More specifically, the second adhesive layer 132 may contact the third circuit surface 123U of the third semiconductor chip 123 and the second bottom surface 122L of the second semiconductor chip 122.

A semiconductor package according to some example embodiments of the present disclosure will hereinafter be described with reference to FIGS. 5 and 6, avoiding redundant descriptions for clarity.

Figure 5:
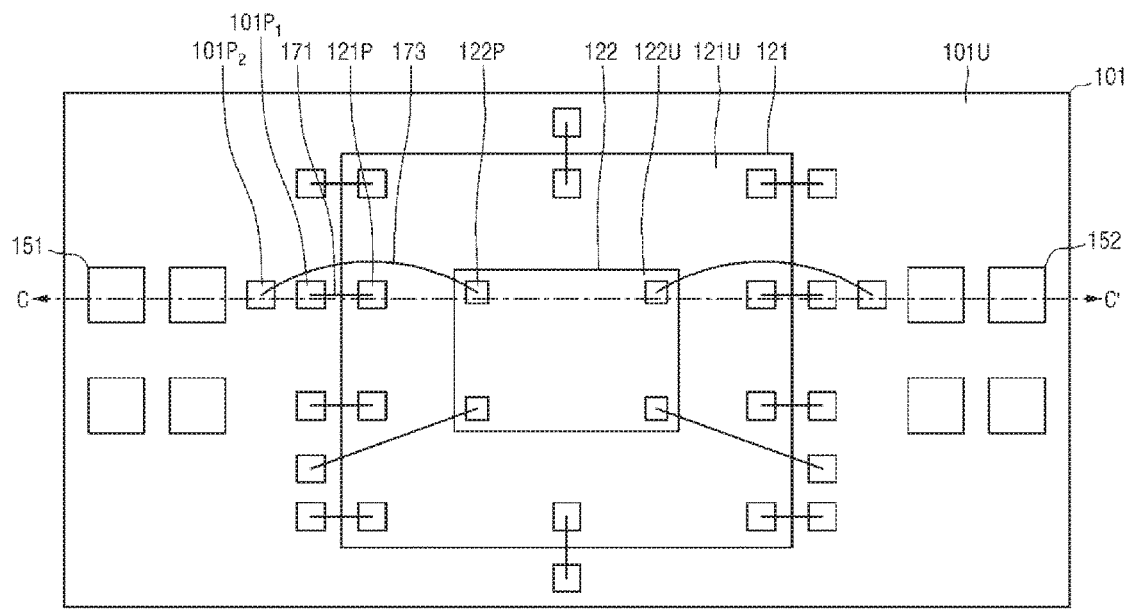
FIG. 5 is a plan view of a semiconductor package according to some example embodiments of the present disclosure.

FIG. 5 is a plan view of a semiconductor package according to some example embodiments of the present disclosure. FIG. 6 is a cross-sectional view taken along line C-C' of FIG. 5. For clarity, a second RDL 102 and an insulating material 140 are not illustrated in FIG. 5.

Figure 6:
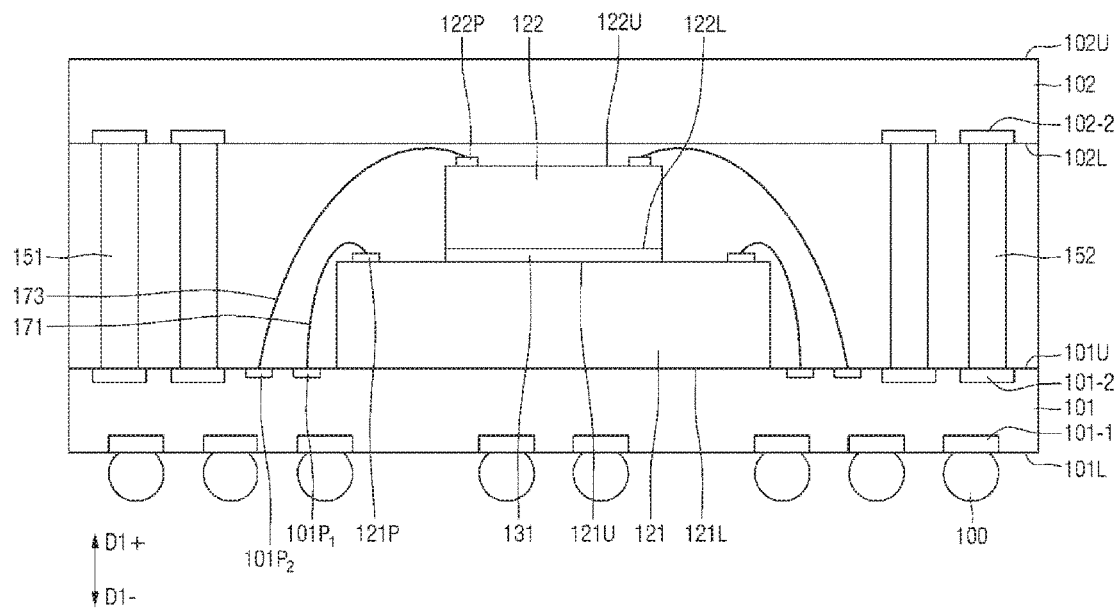
FIG. 6 is a cross-sectional view taken along line C-C' of FIG. 5.

Referring to FIGS. 5 and 6, a second semiconductor chip 122 may be connected to a first RDL 101 via third wire bonds 173, instead of being connected to a second RDL 102 via the contacts 122C of FIG. 2.

The second semiconductor chip 122 may include second I/O pads 122P, which are disposed on a second circuit surface 122U of the second semiconductor chip 122. The second semiconductor chip 122 may be electrically connected to the first RDL 101 via the third wire bonds 173.

For example, the third wire bonds 173 may connect the second I/O pads 122P and second lower contact pads 101P2.

The second RDL 102 may be disposed on the second semiconductor chip 122 to cover the second I/O pads 122P of the second semiconductor chip 122.

In the present example embodiment, like in the previous example embodiments, a first circuit surface 121U of the first semiconductor chip 121 and the second circuit surface 122U of the second semiconductor chip 122 may be disposed to face the same direction, for example, a first direction D1+.

A semiconductor package according to some example embodiments of the present disclosure will hereinafter be described with reference to FIGS. 7 and 8, avoiding redundant descriptions for clarity.

Figure 7:
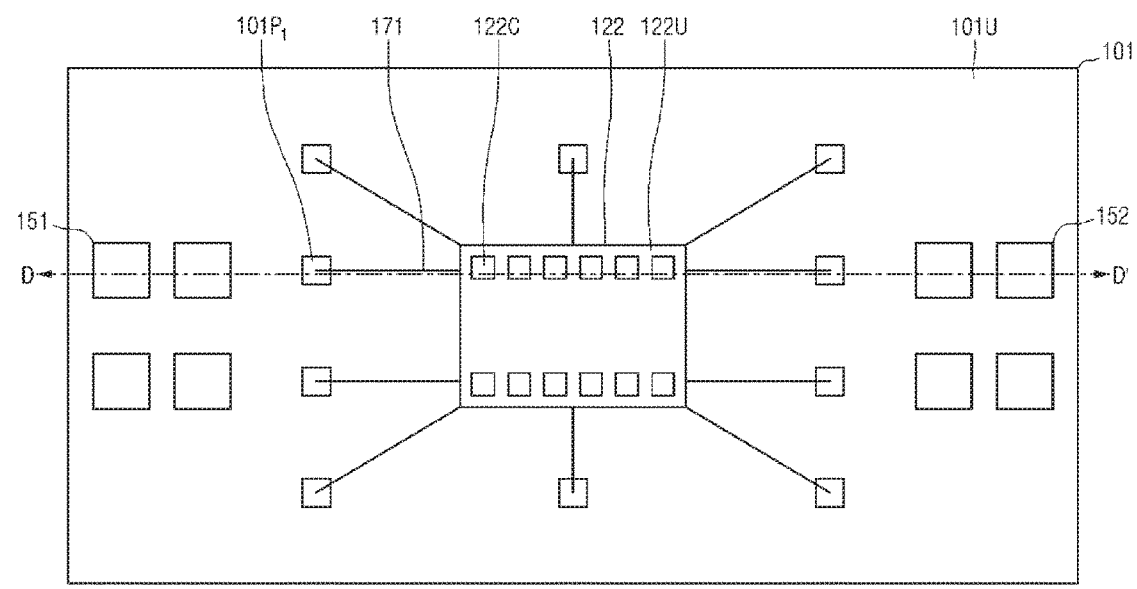
FIG. 7 is a plan view of a semiconductor package according to some example embodiments of the present disclosure.

FIG. 7 is a plan view of a semiconductor package according to some exemplary embodiments of the present disclosure. FIG. 8 is a cross-sectional view taken along line D-D' of FIG. 7. For clarity, a second RDL 102 and an insulating material 140 are not illustrated in FIG. 7.

Figure 8:
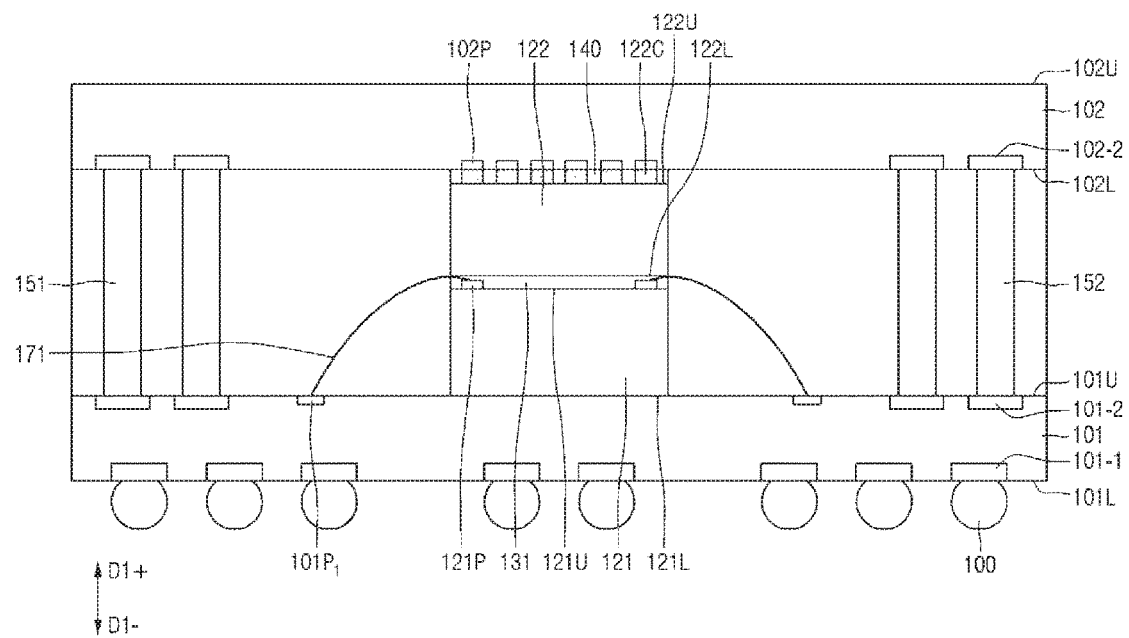
FIG. 8 is a cross-sectional view taken along line D-D' of FIG. 7.

Referring to FIGS. 7 and 8, first and second semiconductor chips 121 and 122 may have substantially the same size. First wire bonds 171 may penetrate a first adhesive layer 131 to connect first I/O pads 121P and first lower contact pads 101P$_1$.

The first I/O pads 121P may be buried in the first adhesive layer 131, but example embodiments are not limited thereto. The first I/O pads 121P may be formed to not protrude from, for example, a first circuit surface 121U of the first semiconductor chip 121.

A semiconductor package according to some example embodiments of the present disclosure will hereinafter be described with reference to FIGS. 9 and 10, avoiding redundant descriptions for clarity.

Figure 9:
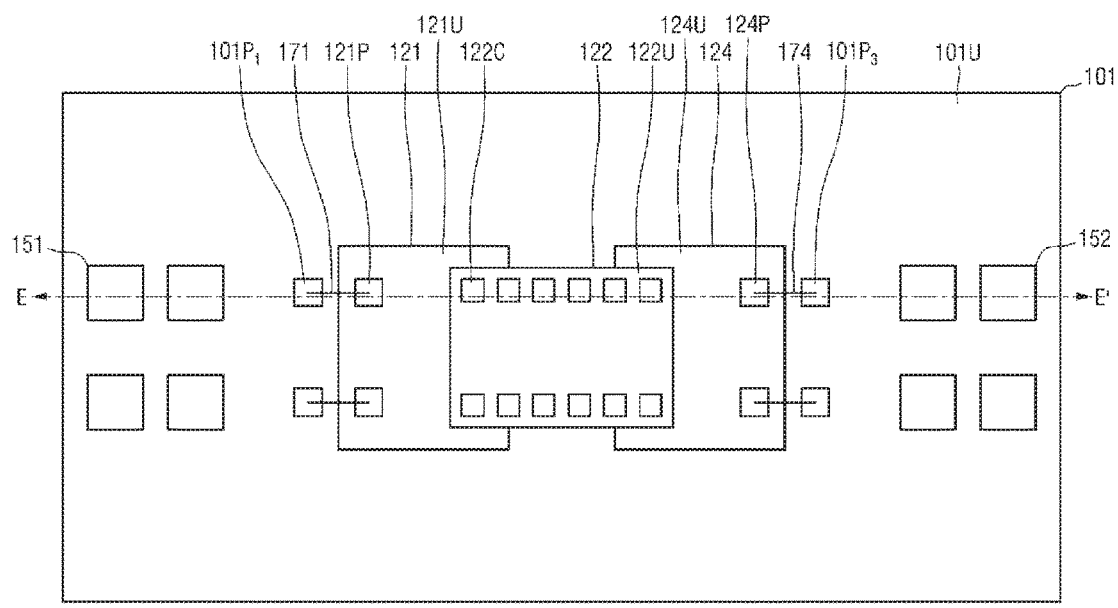
FIG. 9 is a plan view of a semiconductor package according to some example embodiments of the present disclosure.

FIG. 9 is a plan view of a semiconductor package according to some example embodiments of the present disclosure. FIG. 10 is a cross-sectional view taken along line E-E' of FIG. 9. For clarity, a second RDL 102 and an insulating material 140 are not illustrated in FIG. 9.

Figure 10:
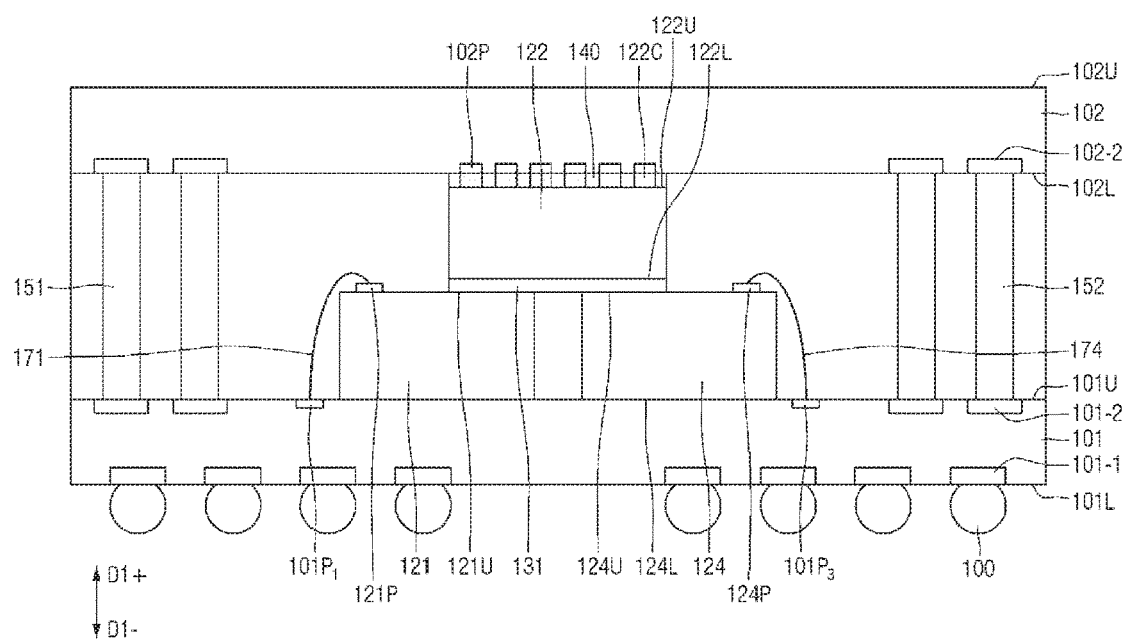
FIG. 10 is a cross-sectional view taken along line E-E' of FIG. 9.

Referring to FIGS. 9 and 10, a semiconductor package according to some example embodiments may further include a fourth semiconductor chip 124, which is disposed between a second semiconductor chip 122 and a first RDL 101.

The fourth semiconductor chip 124 may be disposed on a top surface 101U of the first RDL 101, particularly, between the first RDL 101 and a second bottom surface 122L of the second semiconductor chip 122. The fourth semiconductor chip 124 may be spaced apart from a first semiconductor chip 121.

The fourth semiconductor chip 124 may include a fourth circuit surface 124U and a fourth bottom surface 124L, which are opposite to each other. The fourth bottom surface 124L of the fourth semiconductor chip 124 may contact, for example, the top surface 101U of the first RDL 101.

The fourth circuit surface 124U of the fourth semiconductor chip 124 may be, for example, a surface where circuit patterns are formed. Also, the fourth circuit surface 124U of the fourth semiconductor chip 124 may be, for example, a surface where fourth I/O pads 124P are formed. The fourth circuit surface 124U of the fourth semiconductor chip 124 may be, for example, an opposite surface to the surface where the circuit patterns are formed.

In some example embodiments, the fourth circuit surface 124U of the fourth semiconductor chip 124 may be disposed to face a first direction D1+. For example, the fourth circuit surface 124U of the fourth semiconductor chip 124 may be disposed to face the second RDL 102.

That is, a first circuit surface 121U of the first semiconductor chip 121, a second circuit surface 122U of the second semiconductor chip 122 and the fourth circuit surface 124U of the fourth semiconductor chip 124 may be disposed to face the same direction, for example, the first direction D1+.

The fourth circuit surface 124U of the fourth semiconductor chip 124 may include the fourth I/O pads 124P. In other words, the fourth I/O pads 124P may be disposed on the fourth circuit surface 124U of the fourth semiconductor chip 124. FIGS. 9 and 10 illustrate an example in which the fourth I/O pads 124P are all disposed on the fourth circuit surface 124U of the fourth semiconductor chip 124 to protrude from the fourth circuit surface 124U of the fourth semiconductor chip 124, but example embodiments are not limited to this example.

That is, in other example embodiments, at least some of the fourth I/O pads 124P may be disposed on the fourth circuit surface 124U of the fourth semiconductor chip 124. In still other example embodiments, the fourth I/O pads 124P may all be disposed below the fourth circuit surface 124U of the fourth semiconductor chip 124 such that only the top surfaces of the fourth I/O pads 124P may be exposed at the fourth circuit surface 124U of the fourth semiconductor chip 124.

The fourth I/O pads 124P may comprise, for example, a conductive material.

Fourth wire bonds 174 may connect the fourth I/O pads 124P and third lower contact pads 101P3. That is, the fourth semiconductor chip 124 may be electrically connected to the first RDL 101 via the fourth wire bonds 174, which are connected to the fourth I/O pads 124P.

The first RDL 101 may further include third lower contact pads 101P$_3$. The third lower contact pads 101P$_3$ may be spaced apart from first lower contact pads 101P$_1$. The third lower contact pads 101P$_3$ may be substantially the same as, for example, the first lower contact pads 101P1.

A first adhesive layer 131 may be interposed between the first circuit surface 121U of the first semiconductor chip 121 and the second bottom surface 122L of the second semiconductor chip 122 and between the fourth circuit surface 124U of the fourth semiconductor chip 124 and the second bottom surface 122L of the second semiconductor chip 122. For example, a part of the first adhesive layer 131 may contact the first circuit surface 121U of the first semiconductor chip 121, and another part of the first adhesive layer 131 may contact the fourth circuit surface 124U of the fourth semiconductor chip 124.

The second semiconductor chip 122 may be disposed on the first and fourth semiconductor chips 121 and 124 to expose first I/O pads 121P of the first semiconductor chip 121 and the fourth I/O pads 124P of the fourth semiconductor chip 124. In other words, parts of the first and fourth semiconductor chips 121 and 124 may overlap with the second semiconductor chip 122 in the first direction D1+.

In some example embodiments, the first and fourth semiconductor chips 121 and 124 may both be disposed to overlap with the second semiconductor chip 122, in which case, the first wire bonds 171 may penetrate the first adhesive layer 131 to be connected to the first lower contact pads 101P1, respectively, and the fourth wire bonds 174 may penetrate the first adhesive layer 131 to be connected to the third lower contact pads 101P3, respectively. The first I/O pads 121P may be formed to not protrude from the first circuit surface 121U of the first semiconductor chip 121, and the fourth I/O pads 124P may be formed to not protrude from the fourth circuit surface 124U of the fourth semiconductor chip 124.

A semiconductor package according to some example embodiments of the present disclosure will hereinafter be described with reference to FIGS. 11 and 12, avoiding redundant descriptions for clarity.

Figure 11:
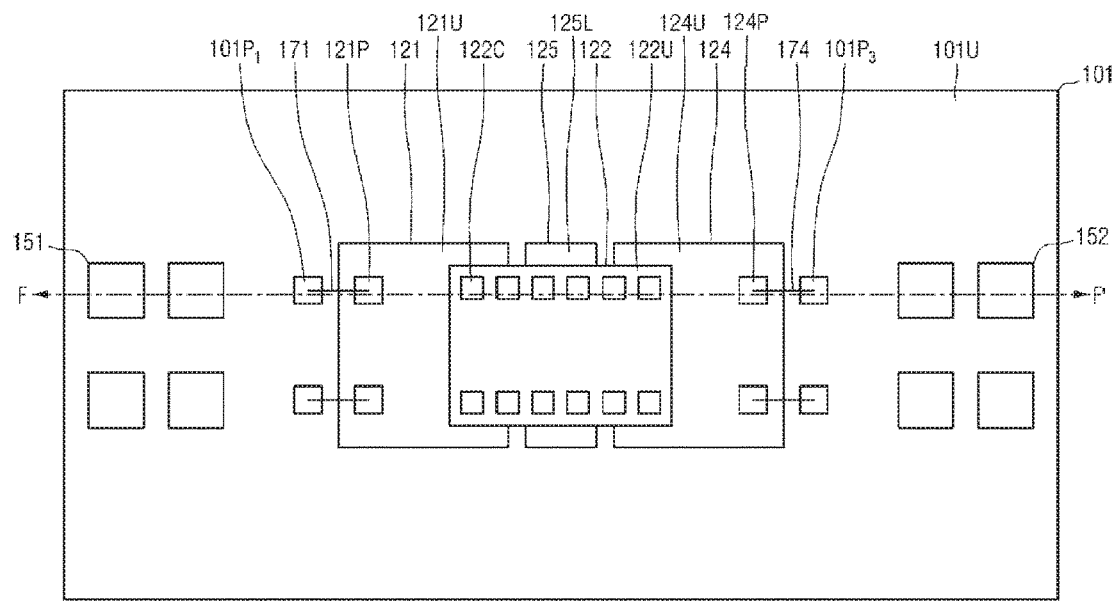
FIG. 11 is a plan view of a semiconductor package according to some example embodiments of the present disclosure.

FIG. 11 is a plan view of a semiconductor package according to some example embodiments of the present disclosure. FIG. 12 is a cross-sectional view taken along line F-F' of FIG. 11. For clarity, a second RDL 102 and an insulating material 140 are not illustrated in FIG. 11.

Figure 12:
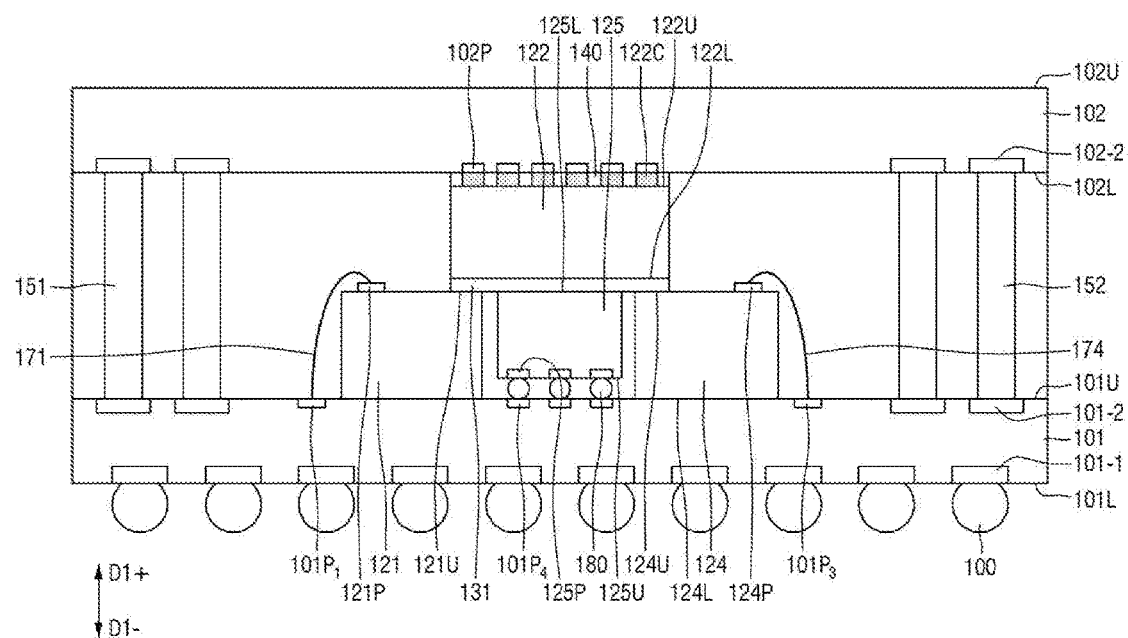
FIG. 12 is a cross-sectional view taken along line F-F' of FIG. 11.

Referring to FIGS. 11 and 12, a semiconductor package according to the present example embodiments may further include a fifth semiconductor chip 125, which is disposed between first and fourth semiconductor chips 121 and 124.

The fifth semiconductor chip 125 may be disposed on a top surface 101U of a first RDL 101, particularly, between the first RDL 101 and a second bottom layer 122L of a second semiconductor chip 122. The fifth semiconductor chip 125 may be spaced apart from the first and fourth semiconductor chips 121 and 124 and may be disposed between the first and fourth semiconductor chips 121 and 124.

The fifth semiconductor chip 125 may include a fifth circuit surface 125U and a fifth bottom surface 125L, which are opposite to each other.

The fifth circuit surface 125U of the fifth semiconductor chip 125 may be, for example, a surface where circuit patterns are formed. Also, the fifth circuit surface 125U of the fifth semiconductor chip 125 may be, for example, a surface where fifth I/O pads 125P are formed. The fifth circuit surface 125U of the fifth semiconductor chip 125 may be, for example, an opposite surface to the surface where the circuit patterns are formed.

In some example embodiments, the fifth circuit surface 125U of the fifth semiconductor chip 125 may be disposed to face a second direction D1−. For example, the fifth circuit surface 125U of the fifth semiconductor chip 125 may be disposed to face the first RDL 101. For example, the fifth semiconductor chip 125 may be disposed on the first RDL 101 in the form of a flip chip.

That is, a first circuit surface 121U of the first semiconductor chip 121, a second circuit surface 122U of the second semiconductor chip 122 and a fourth circuit surface 124U of the fourth semiconductor chip 124 may be disposed to face opposite directions to the fifth circuit surface 125U of the fifth semiconductor chip 125.

The fifth circuit surface 125U of the fifth semiconductor chip 125 may include fifth I/O pads 125P.

The first RDL 101 may further include fourth lower contact pads 101P$_4$. The fourth lower contact pads 101P$_4$ may be spaced apart from first lower contact pads 101P 1 and third lower contact pads 101P$_3$.

The fifth semiconductor chip 125 may be electrically connected to the first RDL 101 via connection terminals 180. The connection terminals 180 may be disposed between the fifth circuit surface 125U of the fifth semiconductor chip 125 and the top surface 101U of the first RDL 101. The connection terminals 180 may be connected to the fifth I/O pads 125P and the fourth lower contact pads 101P$_4$.

A first adhesive layer 131 may be interposed between the first circuit surface 121U of the first semiconductor chip 121 and the second bottom surface 122L of the second semiconductor chip 122, between the fourth circuit surface 124U of the fourth semiconductor chip 124 and the second bottom surface 122L of the second semiconductor chip 122 and between the fifth bottom surface 125L of the fifth semiconductor chip 125 and the second bottom surface 122L of the second semiconductor chip 122. For example, a part of the first adhesive layer 131 may contact the first circuit surface 121U of the first semiconductor chip 121, another part of the first adhesive layer 131 may contact the fourth circuit surface 124U of the fourth semiconductor chip 124, and another part of the first adhesive layer 131 may contact the fifth bottom surface 125L of the fifth semiconductor chip 125.

While example embodiments of the inventive concepts have been particularly shown and described with reference to some example embodiments thereof, it will be understood by those of ordinary skill in the art that various changes in form and details may be made therein without departing from the spirit and scope of the example embodiments of the inventive concepts as defined by the following claims. It is therefore desired that the example embodiments be considered in all respects as illustrative and not restrictive, reference being made to the appended claims rather than the foregoing description to indicate the scope of the example embodiments.

What is claimed is:

1. A semiconductor package, comprising:
 a first redistribution layer (RDL);
 a first semiconductor chip on a top surface of the first RDL, the first semiconductor chip including a first circuit surface and a first bottom surface, the first circuit surface having first I/O pads thereon, the first I/O pads configured to electrically connect the first semiconductor chip to the first RDL via first wire bonds;
 a second semiconductor chip on the first semiconductor chip, the second semiconductor chip including a second circuit surface and a second bottom surface;
 a second RDL on the second semiconductor chip such that the first RDL, the first semiconductor chip, the second semiconductor chip and the second RDL are arranged sequential in a first direction and a bottom surface of the second RDL faces both the first circuit surface and the second circuit surface; and
 first vias and second vias each connected between the first RDL and the second RDL, the first vias and the second vias being spaced apart from each other in a second direction such that an entirety of the first semiconductor chip and the second semiconductor chip are therebetween, the second direction being perpendicular to the first direction.

2. The semiconductor package of claim 1, wherein the second semiconductor chip includes contacts on the second circuit surface thereof, the contacts interposed between the second circuit surface and the second RDL such that the contacts electrically connect the second semiconductor chip to the second RDL.

3. The semiconductor package of claim 1, wherein the second semiconductor chip includes second I/O pads, the second I/O pads electrically connecting the second semiconductor chip to the first RDL via second wire bonds.

4. The semiconductor package of claim 1, further comprising:
a third semiconductor chip between the first semiconductor chip and the second semiconductor chip, the third semiconductor chip including a third circuit surface and a third bottom surface, the third circuit surface facing the second RDL.

5. The semiconductor package of claim 4, wherein
the third semiconductor chip includes third I/O pads electrically connecting the third semiconductor chip to the first RDL via third wire bonds, and
the second semiconductor chip includes contacts on the second surface thereof, the contacts interposed between the second circuit surface and the second RDL such that the contacts electrically connect the second semiconductor chip to the second RDL.

6. The semiconductor package of claim 1, further comprising:
a third semiconductor chip on the top surface of the first RDL such that the third semiconductor chip and the first semiconductor chip have a gap therebetween, the third semiconductor chip including a third circuit surface and a third bottom surface, the third circuit surface facing the second RDL, the third semiconductor chip including third I/O pads on the third circuit surface, the third I/O pads electrically connecting the third semiconductor chip to the first RDL via second wire bonds.

7. The semiconductor package of claim 6, further comprising:
a fourth semiconductor chip in the gap between the first semiconductor chip and the third semiconductor chip, the fourth semiconductor chip including a fourth circuit surface and a fourth bottom surface, the fourth circuit surface facing the first RDL such that the fourth circuit surface faces an opposite direction as the first I/O pads.

8. The semiconductor package of claim 6, wherein the second semiconductor chip includes contacts on the second circuit surface thereof, the contacts being between the second circuit surface and the second RDL such that the contacts electrically connect the second semiconductor chip to the second RDL.

9. A semiconductor package, comprising:
a first semiconductor chip having first I/O pads on a top surface thereof;
a second semiconductor chip on the first semiconductor chip such that the first I/O pads are exposed, the second semiconductor chip having contacts on a top surface thereof;
a first RDL below the first semiconductor chip, the first RDL electrically connected to the first I/O pads via first wire bonds;
a second RDL on the second semiconductor chip such that the second RDL covers the contacts and the first RDL, the first semiconductor chip, the second semiconductor chip and the second RDL are arranged sequential in a first direction; and
first vias and second vias each connected between the first RDL and the second RDL, the first vias and the second vias being spaced apart from each other in a second direction such that an entirety of the first semiconductor chip and the second semiconductor chip are therebetween, the second direction being perpendicular to the first direction.

10. The semiconductor package of claim 9, further comprising:
a third semiconductor chip between the first semiconductor chip and the second semiconductor chip and having a footprint less than that of the first semiconductor chip to expose the first I/O pads, the third semiconductor chip including second I/O pads on a top surface thereof, wherein
the second semiconductor chip has a footprint less than that of the third semiconductor chip to expose the second I/O pads, and
the third semiconductor chip is electrically connected to the first RDL via the second I/O pads and second wire bonds.

11. The semiconductor package of claim 9, wherein the top surface of the first semiconductor chip and the top surface of the second semiconductor chip face a same direction such that the first I/O pads and the contacts face the same direction.

12. The semiconductor package of claim 9, further comprising:
a third semiconductor chip on the first RDL such that the third semiconductor chip and the first semiconductor chip have a gap therebetween, the third semiconductor chip including second I/O pads on a top surface thereof, the second I/O pads electrically connecting the third semiconductor chip to the first RDL, wherein
the second semiconductor chip has a footprint that is less than that of the first semiconductor chip and the third semiconductor chip with the gap therebetween to expose the second I/O pads.

13. The semiconductor package of claim 12, wherein the top surface of the first semiconductor chip, the top surface of the second semiconductor chip, and the top surface of the third semiconductor chip face a same direction such that the first I/O pads, the contacts, and the second I/O pads face the same direction.

14. The semiconductor package of claim 12, further comprising:
a fourth semiconductor chip in the gap between the first semiconductor chip and the third semiconductor chip, the fourth semiconductor chip including third I/O pads on a surface thereof, the surface of the fourth semiconductor chip facing an opposite direction as the top surface of the first semiconductor chip and the top surface of the third semiconductor chip such that the third I/O pads face the opposite direction as the first I/O pads and the second I/O pads.

15. A semiconductor package comprising:
a plurality of first semiconductor chips sequentially stacked in a first direction between a first redistribution layer (RDL) and a second RDL, the plurality of first semiconductor chips each having a circuit surface facing a same direction, a footprint of the plurality of semiconductor chips decreasing from the first RDL to the second RDL such that at least one of the plurality of first semiconductor chips includes at least one input/ output (I/O) pad on an exposed portion of the circuit surface associated therewith, wherein first vias and second vias are each connected between the first RDL and the second RDL, the first vias and the second vias being spaced apart from each other in a second direction such that an entirety of the plurality of first semiconductor chips are therebetween, the second direction being perpendicular to the first direction, and the plurality of first semiconductor chips include a first semiconductor chip and a second semiconductor chip sequentially stacked between the first RDL and the second RDL, the footprint of second semiconductor chip being less than the footprint of the first semiconductor chip, the circuit surface of the first semiconductor chip including the exposed portion having first I/O pads of the at least one I/O pad thereon, the first I/O pads being electrically connected to the first RDL via first wire bonds.

16. The semiconductor package of claim 15, wherein the second semiconductor chip includes contacts on the circuit surface associated therewith such that the contacts electrically connect the second semiconductor chip to the second RDL.

17. The semiconductor package of claim 15, wherein the circuit surface of the second semiconductor chip includes the exposed portion having second I/O pads of the at least one I/O pad thereon, the second I/O pads electrically connecting the second semiconductor chip to the first RDL via second wire bonds.

18. The semiconductor package of claim 15, wherein the first semiconductor chip includes two first semiconductor chips on the first RDL with a gap therebetween, each of the two first semiconductor chips including one of the first I/O pads thereon, the footprint of second semiconductor chip being less than the footprint of the two first semiconductor chips with the gap therebetween to expose the first I/O pads.

* * * * *